US012660225B2

(12) United States Patent
Chen et al.

(10) Patent No.: US 12,660,225 B2
(45) Date of Patent: Jun. 16, 2026

(54) METHOD OF MANUFACTURING A THIN-FILM TRANSISTOR HAVING A METAL CROSS OVER STRUCTURE

(71) Applicant: MIKRO MESA TECHNOLOGY CO., LTD., Apia (WS)

(72) Inventors: Li-Yi Chen, Tainan (TW); Chieh-Ting Chen, Hsinchu (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 426 days.

(21) Appl. No.: 18/530,219

(22) Filed: Dec. 6, 2023

(65) Prior Publication Data

US 2025/0194135 A1      Jun. 12, 2025

(51) Int. Cl.
*H10D 30/01*          (2025.01)
(52) U.S. Cl.
CPC ................................. *H10D 30/031* (2025.01)
(58) Field of Classification Search
CPC ............. H10D 30/031; H10D 30/6729; H10D 30/6755; H10D 86/0231
See application file for complete search history.

(56) References Cited

U.S. PATENT DOCUMENTS

| | | | | |
|---|---|---|---|---|
| 6,288,414 B1* | 9/2001 | Ahn | ...................... | H10D 30/673 |
| | | | | 257/E29.151 |
| 8,421,135 B2* | 4/2013 | Yamazaki | .............. | H10D 86/60 |
| | | | | 438/149 |
| 2002/0168788 A1* | 11/2002 | Wu | ..................... | H10D 30/6729 |
| | | | | 438/30 |
| 2006/0292760 A1* | 12/2006 | Shih | .................... | G02F 1/13458 |
| | | | | 438/149 |
| 2013/0071973 A1* | 3/2013 | Beak | .................. | H10D 86/0231 |
| | | | | 438/158 |

* cited by examiner

*Primary Examiner* — Wael M Fahmy
*Assistant Examiner* — Tiberiu Dan Onuta
(74) *Attorney, Agent, or Firm* — CKC & Partners Co., LLC

(57)          ABSTRACT
A method of manufacturing a thin-film transistor TFT with a metal cross over structure includes: etching the first metal layer through a first patterned photoresist to form a gate electrode and a lower metal pattern; anodizing the first metal layer; removing the first patterned photoresist; depositing a semiconductor layer on the etched first metal layer; depositing a second metal layer on the semiconductor layer; anodizing the second metal layer through a second patterned photoresist to form an anodized segment; and etching the second metal layer through the second patterned photoresist to form first and second upper metal patterns, in which the first upper metal pattern has drain and source electrodes connected to the anodized segment and electrically isolated from each other by the anodized segment, and the second upper metal pattern forms a metal cross over structure with the lower metal pattern.

42 Claims, 11 Drawing Sheets

$110'\begin{cases} GE \\ LP \\ LE \end{cases}$ $110'\begin{cases} GE \\ LP \\ LE \end{cases}$ $110'\begin{cases} GE \\ LP \\ LE \end{cases}$

S1

Gl(LE)

UP2

Gl(LP)

UP2

M1

M2

METHOD OF MANUFACTURING A THIN-FILM TRANSISTOR HAVING A METAL CROSS OVER STRUCTURE

BACKGROUND

Field of Invention

The present disclosure relates to a method of manufacturing a thin-film transistor with a metal cross over structure.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a method of manufacturing a thin-film transistor (TFT) with a metal cross over structure includes: forming a first patterned photoresist on a first metal layer containing a content of aluminum greater than 80 wt %, in which the first patterned photoresist has first, second, and third mask portions, and the third mask portion is thicker than the first and second mask portions; etching the first metal layer through the first patterned photoresist to form a gate electrode, a lower metal pattern, and a lower metal electrode respectively covered by the first, second, and third mask portions; removing the first and second mask portions; anodizing the etched first metal layer, in which the anodized lower metal electrode has a surface portion that is unanodized and in contact with the third mask portion; removing the third mask portion to expose the surface portion; depositing a semiconductor layer to cover the gate electrode, the lower metal pattern, and the lower metal electrode; depositing a second metal layer on the semiconductor layer, in which a surface of the second metal layer in contact with the semiconductor layer contains aluminum; forming a second patterned photoresist on the second metal layer, in which the second patterned photoresist has a first hollow portion exposing a surface portion of the second metal layer; anodizing the surface portion of the second metal layer through the second patterned photoresist until the second metal layer has an anodized segment extended from the surface portion of the second metal layer to a side of the second metal layer facing the semiconductor layer; forming second hollow portions in the second patterned photoresist; and etching the second metal layer through the second hollow portions to form a first upper metal pattern and a second upper metal pattern, in which the first upper metal pattern is above the gate electrode and has drain and source electrodes connected to the anodized segment and electrically isolated from each other by the anodized segment, and the second upper metal pattern forms a metal cross over structure and a contact structure respectively with the lower metal pattern and the lower metal electrode.

According to some embodiments of the present disclosure, a method of manufacturing a TFT with a metal cross over structure includes: forming a first patterned photoresist on a first metal layer containing a content of aluminum greater than 80 wt %, in which the first patterned photoresist has first, second, and third mask portions, and the third mask portion is thicker than the first and second mask portions; etching the first metal layer through the first patterned photoresist to form a gate electrode, a lower metal pattern, and a lower metal electrode respectively covered by the first, second, and third mask portions; removing the first and second mask portions; anodizing the etched first metal layer, in which the anodized lower metal electrode has a surface portion that is unanodized and in contact with the third mask portion; removing the third mask portion to expose the surface portion; depositing a semiconductor layer to cover the gate electrode, the lower metal pattern, and the lower metal electrode; depositing a second metal layer on the semiconductor layer, in which a surface of the second metal layer in contact with the semiconductor layer contains aluminum; etching the second metal layer through a second patterned photoresist to form a first upper metal pattern and a second upper metal pattern, the first upper metal pattern is above the gate electrode and covered by a first mask portion of the second patterned photoresist, and the second upper metal pattern forms a metal cross over structure and a contact structure respectively with the lower metal pattern and the lower metal electrode and covered by a second mask portion of the second patterned photoresist; removing a part of the first mask portion of the second patterned photoresist to expose a surface portion of the first upper metal pattern; and anodizing the surface portion of the first upper metal pattern until the first upper metal pattern has drain and source electrodes and an anodized segment connected between and electrically isolating the drain and source electrodes.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
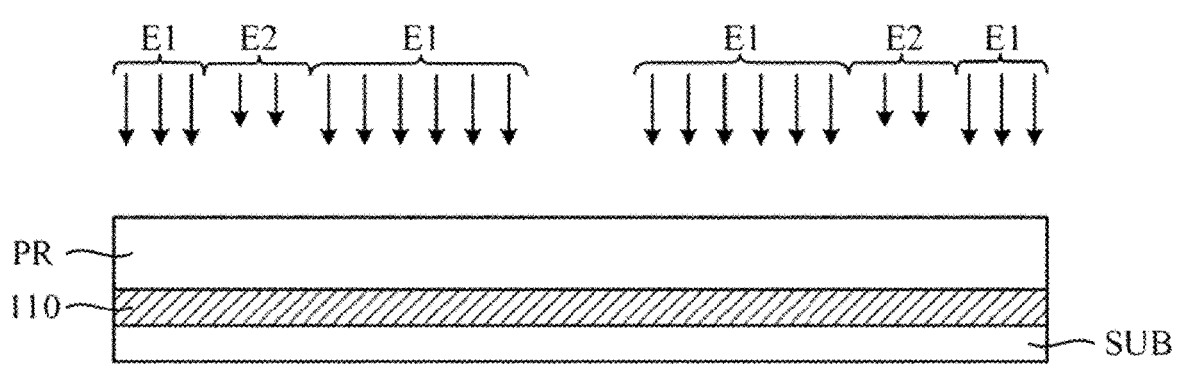
FIGS. 1A to 1K are schematic cross-sectional views of intermediate stages of a method of manufacturing a thin-film transistor with a metal cross over structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

Reference is made to FIG. 1A. FIG. 1A is a schematic cross-sectional view of an intermediate stage of a method of manufacturing a thin-film transistor with a metal cross over structure according to some embodiments of the present disclosure. As shown in FIG. 1A, a first metal layer 110 is formed on a substrate SUB, and a photoresist PR is formed on the first metal layer 110. The first metal layer 110 contains a content of aluminum greater than 80 wt %. A material of the photoresist PR is positive tone photoresist. First regions of the photoresist PR are exposed with a first exposure dose E1 of light. Second regions of the photoresist PR are exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

Figure 1B:
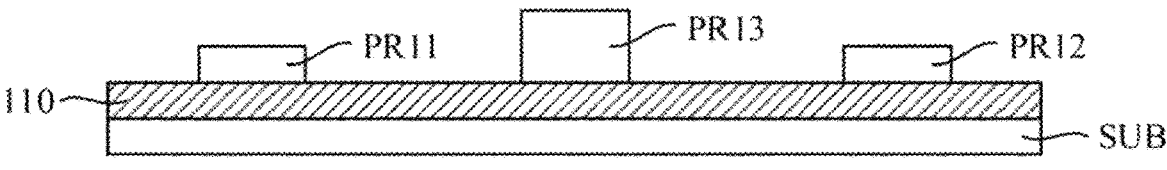

Reference is made to FIG. 1B. FIG. 1B is a schematic cross-sectional view of an intermediate stage of a method of manufacturing a thin-film transistor with a metal cross over structure according to some embodiments of the present disclosure. The intermediate stage shown in FIG. 1A may be sequentially followed by the intermediate stage shown in FIG. 1B. As shown in FIG. 1B, the exposed photoresist PR is then developed to form a first patterned photoresist PR1. The first patterned photoresist PR1 has a first mask portion PR11, a second mask portion PR12, and a third mask portion PR13. The third mask portion PR13 is thicker than the first mask portion PR11 and the second mask portion PR12. It can be seen that the regions of the photoresist PR exposed with the first exposure dose E1 will be entirely removed, the regions of the photoresist PR exposed with the second exposure dose E2 will be partially removed to form the first mask portion PR11 and the second mask portion PR12, and the regions of the photoresist PR not exposed will be originally remained to form the third mask portion PR13.

Figure 1C:
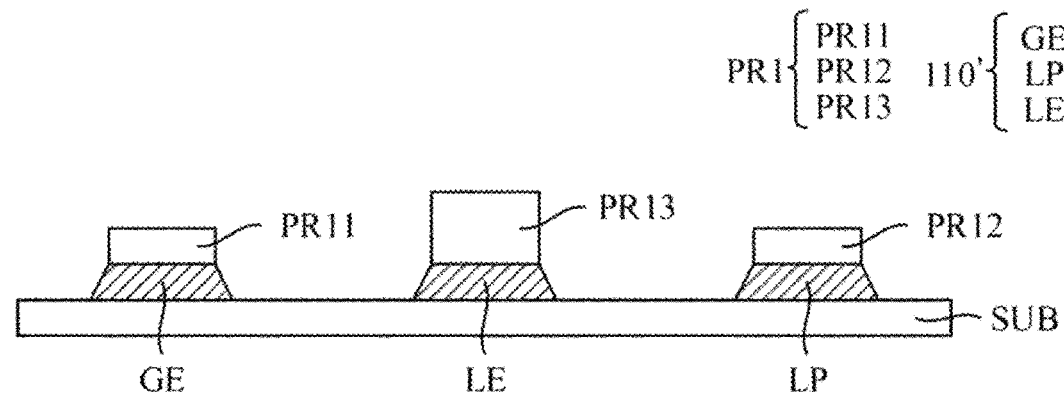

Reference is made to FIG. 1C. FIG. 1C is a schematic cross-sectional view of an intermediate stage of a method of manufacturing a thin-film transistor with a metal cross over structure according to some embodiments of the present disclosure. The intermediate stage shown in FIG. 1B may be sequentially followed by the intermediate stage shown in FIG. 1C. As shown in FIG. 1C, the first metal layer 110 is etched through the first patterned photoresist PR1 to form a gate electrode GE, a lower metal pattern LP, and a lower metal electrode LE that are respectively covered by the first mask portion PR11, the second mask portion PR12, and the third mask portion PR13.

In some embodiments, a wet etching process may be performed to etch the first metal layer 110. In some embodiments, a PAN etchant (a mixture of phosphoric acid, acetic acid, nitric acid, and water) may be used in the wet etching process. For example, a mixing ratio of phosphoric acid, acetic acid, nitric acid, and water may be 16:1:1:2, but the present disclosure is not limited in this regard. In some other embodiments, hydrogen peroxide and sulfuric acid may be used in the wet etching process.

In some embodiments, a dry etching process may be performed to etch the first metal layer 110. For example, the dry etching process may be an ECCP (Enhanced Capacitance Coupled Plasma) process using, for example, $Cl_2$ and $BCl_3$, but the present disclosure is not limited in this regard.

Figure 1D:
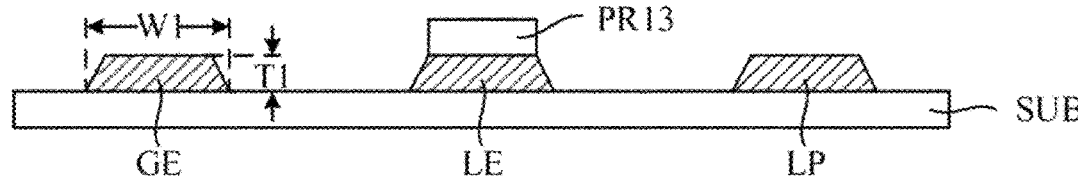

Reference is made to FIG. 1D. FIG. 1D is a schematic cross-sectional view of an intermediate stage of a method of manufacturing a thin-film transistor with a metal cross over structure according to some embodiments of the present disclosure. The intermediate stage shown in FIG. 1C may be sequentially followed by the intermediate stage shown in FIG. 1D. As shown in FIG. 1D, the first mask portion PR11 and the second mask portion PR12 are removed to expose the top surfaces of the gate electrode GE and the lower metal pattern LP. In some embodiments, an ashing process is performed to the first mask portion PR11, the second mask portion PR12, and the third mask portion PR13 until the first mask portion PR11 and the second mask portion PR12 are entirely removed and the third mask portion PR13 still covers the top surface of the lower metal electrode LE. In some embodiments, oxygen plasma is used in the ashing process to perform the erosion of the first mask portion PR11, the second mask portion PR12, and the third mask portion PR13.

Figure 1E:
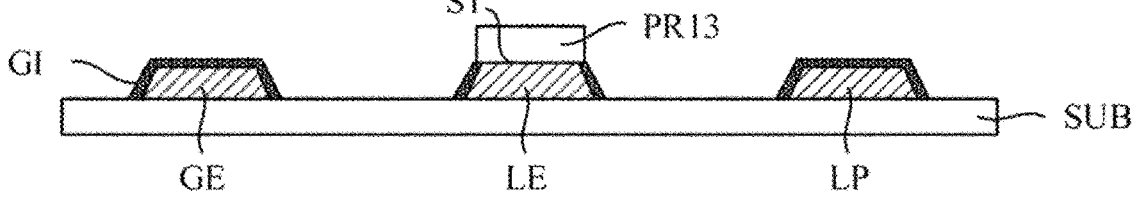

Reference is made to FIG. 1E. FIG. 1E is a schematic cross-sectional view of an intermediate stage of a method of manufacturing a thin-film transistor with a metal cross over structure according to some embodiments of the present disclosure. The intermediate stage shown in FIG. 1D may be sequentially followed by the intermediate stage shown in FIG. 1E. As shown in FIG. 1E, the etched first metal layer 110' is anodized. The gate electrode GE, the lower metal pattern LP, and the lower metal electrode LE are partially anodized after the anodizing and thus have anodized parts GI (i.e., anodic oxide). The anodized part GI of the anodized gate electrode GE serves as a gate insulator. The anodized lower metal electrode LE has a surface portion S1 that is unanodized and in contact with the third mask portion PR13.

In some embodiments, the etched first metal layer 110' is anodized to reach a termination voltage. The gate electrode GE has a thickness T1 (e.g., a vertical length of the gate electrode GE in FIG. 1D) and a width W1 (e.g., a lateral length of the gate electrode GE in FIG. 1D) before being anodized, and the termination voltage is less than a smallest one of the thickness T1 and the width W1 in nm divided by 0.9 nm-V$^{-1}$. In this way, the etched first metal layer 110' will not be fully anodized and leave conductive parts.

In some embodiments, the width W1 of the gate electrode GE is greater than the thickness T1 of the gate electrode GE, but the disclosure is not limited in this regard.

In some embodiments, the termination voltage that the etched first metal layer 110' is anodized to reach is greater than 10 Volt and smaller than 500 Volt. It should be pointed out that if the etched first metal layer 110' is anodized to reach a termination voltage greater than 500 Volt, the thickness of the anodized parts GI of the etched first metal layer 110' (e.g., the anodized part GI of the gate electrode GE) may be too thick and result in high operation voltage of thin-film transistors.

In some embodiments, the etched first metal layer 110' is anodized by applying a constant current greater than 0.5 mA/cm$^2$.

In some embodiments, the etched first metal layer 110' is anodized until the termination voltage is reached and kept for at least 300 seconds. It makes more uniform thickness of the anodized parts GI of the etched first metal layer 110'.

In some embodiments, an annealing process may be performed to the anodized first metal layer 110'. In this way, the resistance of the anodized first metal layer 110' (e.g., the anodized part GI of the anodized gate electrode GE) to a second wet etching process (if any) can be increased. In some embodiments, an annealing temperature used in the annealing process is greater than 150° C., but the disclosure is not limited in this regard.

In some embodiments, the etched first metal layer 110' is anodized by using an electrolyte with a pH value between pH5 and pH8. It should be pointed out that if the pH value is smaller than pH5 or greater than pH8, there will be more pores in the anodized parts GI of the etched first metal layer 110'.

In some embodiments, the etched first metal layer 110' is anodized by using an electrolyte containing a content of water less than 45 wt %. In this way, the Hydrogen content in the anodized parts GI of the etched first metal layer 110' can be small. The Hydrogen content may reduce the breakdown voltage of the gate insulator. Hydrogen sometimes affects the semiconductor layer A (introduced below) and reduces its stability.

In some embodiments, the etched first metal layer 110' is anodized by using an electrolyte containing water, ethylene glycol, and ammonium tartrate. For example, the electrolyte may contain ethylene glycol of about 68.5 wt %, water of about 30 wt %, and ammonium tartrate of about 1.5 wt %, but the disclosure is not limited in this regard.

In some embodiments, the etched first metal layer 110' is anodized at a temperature under 15° C. In this way, the anodized parts GI of the etched first metal layer 110' will be denser and thus the quality can be improved.

Figure 2:
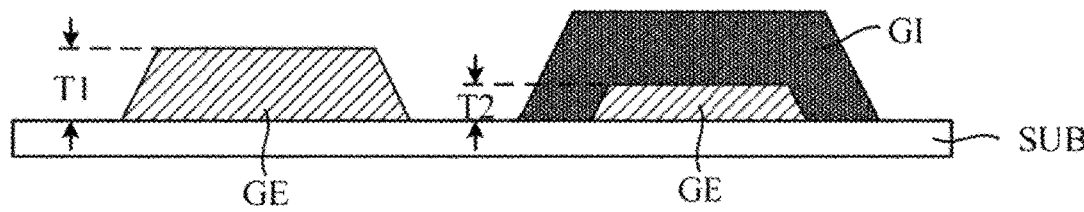
FIG. 2 is a schematic cross-sectional view of a gate electrode before and after being anodized according to some embodiments of the present disclosure.

Reference is made to FIG. 2. FIG. 2 is a schematic cross-sectional view of the gate electrode GE before and after being anodized according to some embodiments of the present disclosure. As shown in FIG. 2, in some embodiments, a thickness of the unanodized part of the anodized gate electrode GE is equal to or greater than $\frac{1}{10}$ of a thickness of the gate electrode GE before the etched first metal layer 110' is anodized. In this way, the resistance of the etched first metal layer 110' will not be too large.

Figure 1F:
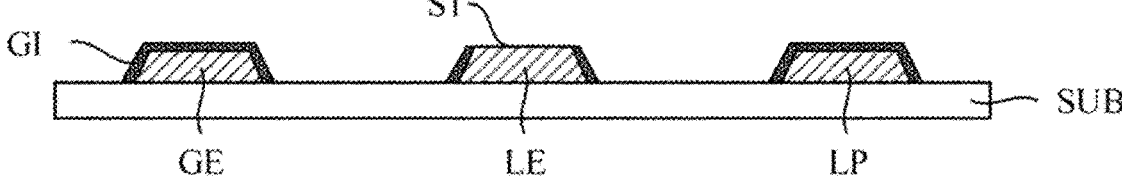

Reference is made to FIG. 1F. FIG. 1F is a schematic cross-sectional view of an intermediate stage of a method of manufacturing a thin-film transistor with a metal cross over structure according to some embodiments of the present disclosure. The intermediate stage shown in FIG. 1E may be sequentially followed by the intermediate stage shown in FIG. 1F. As shown in FIG. 1F, the third mask portion PR13 is removed to expose the surface portion S1 of the lower metal electrode LE that is unanodized.

Figure 1G:
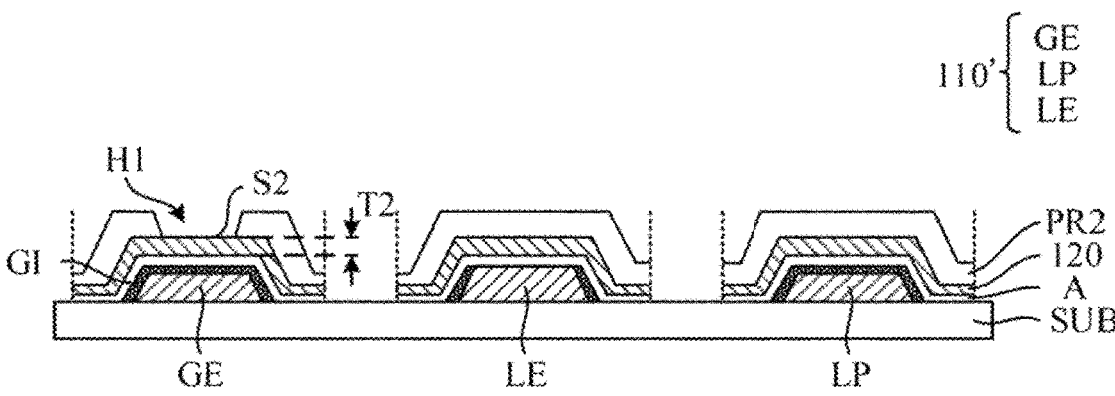

Reference is made to FIG. 1G. FIG. 1G is a schematic cross-sectional view of an intermediate stage of a method of manufacturing a thin-film transistor with a metal cross over structure according to some embodiments of the present disclosure. The intermediate stage shown in FIG. 1F may be sequentially followed by the intermediate stage shown in FIG. 1G. As shown in FIG. 1G, a semiconductor layer A is deposited on the anodized first metal layer 110' to cover the gate electrode GE, the lower metal pattern LP, and the lower metal electrode LE, such that the gate electrode GE, the lower metal pattern LP, and the lower metal electrode LE are in contact with the semiconductor layer A.

In some embodiments, the semiconductor layer A is an oxide semiconductor layer. In addition, the semiconductor layer A includes at least one element of aluminum, gallium, indium, zinc, tin, and zirconium, but the disclosure is not limited in this regard. In some other embodiments, the semiconductor layer A includes MoS$_2$.

In some embodiments, a thickness of the semiconductor layer A is smaller than 100 nm. In this regard, the back channel leakage may be reduced in certain circumstances.

In some embodiments, the semiconductor layer A may be deposited by a PVD (Physical Vapor Deposition) process or a CVD (Chemical Vapor Deposition) process.

In some embodiments, the semiconductor layer A may be a multi-layer structure containing different compositions. For example, the semiconductor layer A may be a double-layer structure including IZO (indium gallium zinc oxide) and IGZTO (indium gallium zinc tin oxide), but the disclosure is not limited in this regard. In this way, the channel mobility can be improved.

As shown in FIG. 1G, a second metal layer 120 is deposited on the semiconductor layer A. It should be pointed out that a surface of the second metal layer 120 in contact with the semiconductor layer A contains metal that can be anodized (e.g., aluminum). A second patterned photoresist PR2 is formed on the second metal layer 120. The formation method of the second patterned photoresist PR2 may be the same as or similar to that of the first patterned photoresist PR1, so the formation of the second patterned photoresist PR2 can be referred to the description about FIGS. 1A and 1B and will not be repeated here. The second patterned photoresist PR2 has a first hollow portion H1 exposing a surface portion S2 of the second metal layer 120.

In some embodiments, the step of depositing the semiconductor layer A and the step of depositing the second metal layer 120 are performed continuously in vacuum. That is, the semiconductor layer A does not come into contact with the atmosphere before the second metal layer 120 is deposited. In some other embodiments, the step of depositing the semiconductor layer A and the step of depositing the second metal layer 120 are performed in chambers with transferring in vacuum. In this way, the oxide semiconductor layer A can be prevented from contacting with air.

Figure 1H:
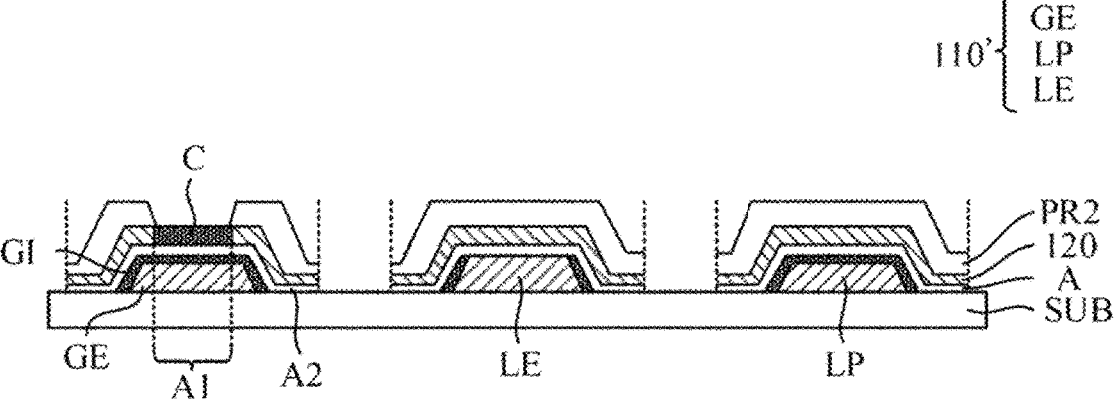

Reference is made to FIG. 1H. FIG. 1H is a schematic cross-sectional view of an intermediate stage of a method of manufacturing a thin-film transistor with a metal cross over structure according to some embodiments of the present disclosure. The intermediate stage shown in FIG. 1G may be sequentially followed by the intermediate stage shown in FIG. 1H. As shown in FIG. 1H with reference to FIG. 1G, the surface portion S2 of the second metal layer 120 is anodized through the second patterned photoresist PR2 until the second metal layer 120 has an anodized segment C (i.e., anodic oxide) extended from the surface portion S2 of the second metal layer 120 to a side of the second metal layer 120 facing the semiconductor layer A. As mentioned above, the surface of the second metal layer 120 in contact with the semiconductor layer A contains metal that can be anodized (e.g., aluminum), so that the second metal layer 120 can be anodized to extend the anodized segment C to the side of the second metal layer 120 facing the semiconductor layer A.

In some embodiments, the surface portion S2 of the second metal layer 120 is anodized to reach a termination voltage. The second metal layer 120 has a thickness T2 before being anodized, as shown in FIG. 1G. The termination voltage is greater than the thickness T2 in nm divided by 1.5 nm-$V^{-1}$. In this way, it can be ensured that the anodized segment C can reach the side of the second metal layer 120 facing the semiconductor layer A.

In some embodiments, as shown in FIG. 1H, the semiconductor layer A has an active area A1 and an inactive area A2. The active area A1 is covered by and in contact with the anodized segment C. The active area A1 may be defined by a vertical projection of the anodized segment C projected on the semiconductor layer A. The inactive area A2 is covered by and in contact with the other conductive segment of the second metal layer 120. In order to reduce the contact resistance of the inactive area A2 relative to the second metal layer 120, an annealing process may be performed to make the inactive area A2 react with aluminum in the second metal layer 120. Aluminum increases the oxygen vacancies of the inactive area A2 of the semiconductor layer A. The annealing process also improves the stability of the active area A1 of the semiconductor layer A.

Figure 1I:
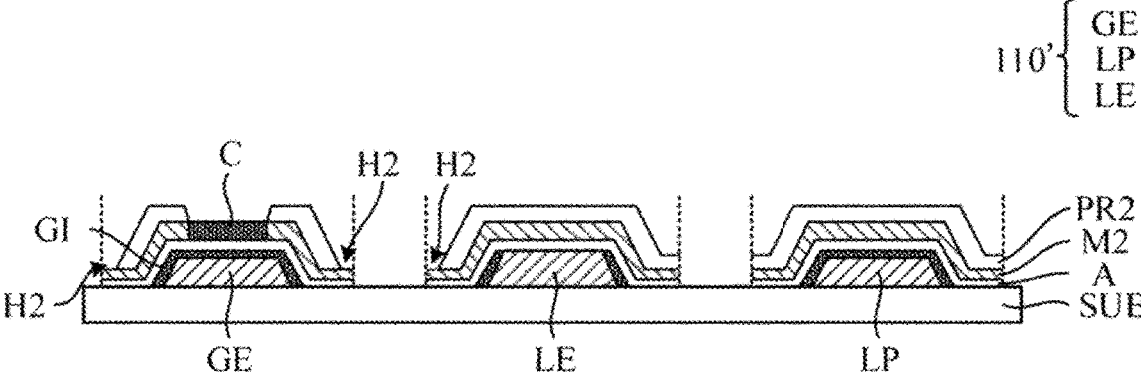

Reference is made to FIG. 1I. FIG. 1I is a schematic cross-sectional view of an intermediate stage of a method of manufacturing a thin-film transistor with a metal cross over structure according to some embodiments of the present disclosure. The intermediate stage shown in FIG. 1H may be sequentially followed by the intermediate stage shown in FIG. 1I. As shown in FIG. 1I, second hollow portions H2 are formed in the second patterned photoresist PR2. In some embodiments, an ashing process is performed to the second patterned photoresist PR2 until the second hollow portions H2 are formed to expose portions of the second metal layer 120. In some embodiments, oxygen plasma is used in the ashing process to perform the erosion of the second patterned photoresist PR2.

Figure 1J:
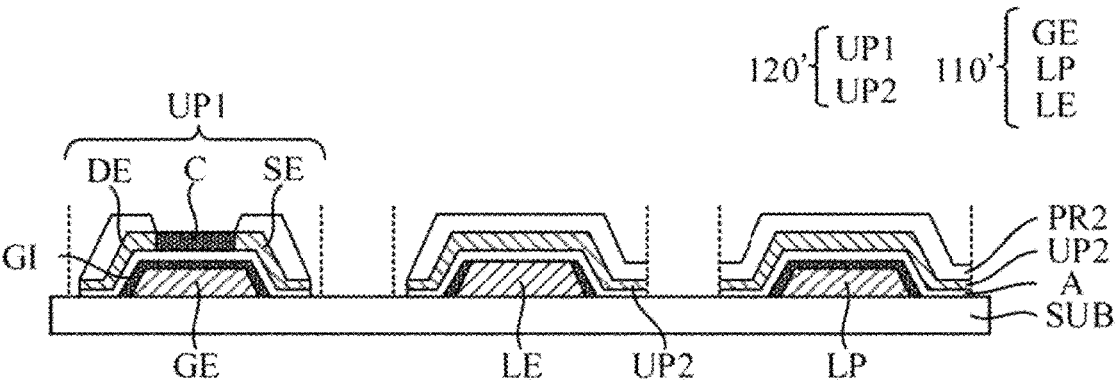

Reference is made to FIG. 1J. FIG. 1J is a schematic cross-sectional view of an intermediate stage of a method of manufacturing a thin-film transistor with a metal cross over structure according to some embodiments of the present disclosure. The intermediate stage shown in FIG. 1I may be sequentially followed by the intermediate stage shown in FIG. 1J. As shown in FIG. 1J, the second metal layer 120 is etched through the second hollow portions H2, such that a first upper metal pattern UP1 and a second upper metal pattern UP2 are formed from the second metal layer 120. The semiconductor layer A is then etched. The first upper metal pattern UP1 is above the anodized gate electrode GE and has a drain electrode DE and a source electrode SE. The drain electrode DE and the source electrode SE are connected to the anodized segment C and electrically isolated from each other by the anodized segment C. The anodized segment C serves as a channel protect structure. The second upper metal pattern UP2 is above the lower metal pattern LP and the lower metal electrode LE. The second upper metal pattern UP2 forms a metal cross over structure with the lower metal pattern LP. In addition, the second upper metal pattern UP2 forms a contact structure with the lower metal electrode LE.

In some embodiments, an etch selectivity of the second metal layer 120 and the anodized segment C in the step of etching the second metal layer 120 (as shown in FIG. 1J) is higher than 2.0.

In some embodiments, a wet etching process may be performed to etch the second metal layer 120. In some embodiments, a PAN etchant (a mixture of phosphoric acid, acetic acid, nitric acid, and water) may be used in the wet etching process. For example, a mixing ratio of phosphoric acid, acetic acid, nitric acid, and water may be 16:1:1:2, but the present disclosure is not limited in this regard.

In some embodiments, the second metal layer 120 and the semiconductor layer A may be etched by using different etchants, respectively. For example, in an embodiment where the semiconductor layer A is an oxide semiconductor layer and includes tin, the PAN etchant may be not easy to etch the semiconductor layer A. To etch this kind of semiconductor layer A, oxalic acid or formic acid may be used, but the present disclosure is not limited in this regard.

Figure 1K:
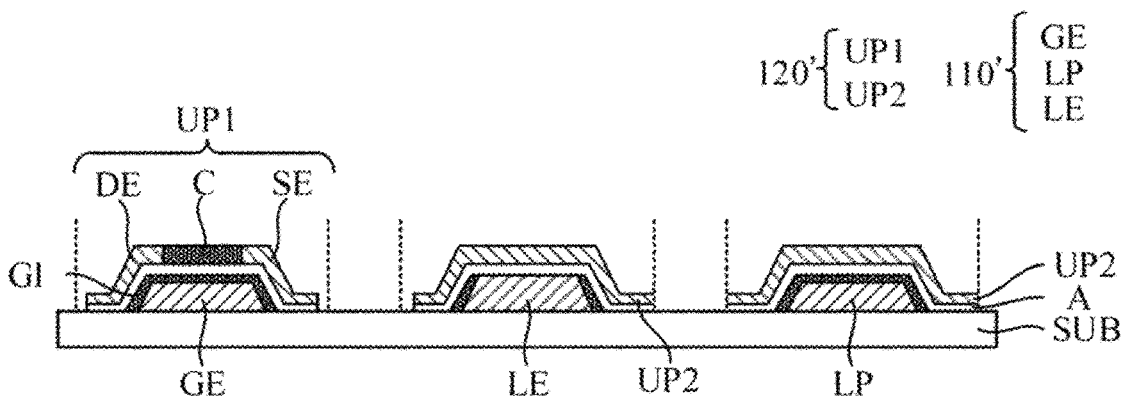

Reference is made to FIG. 1K. FIG. 1K is a schematic cross-sectional view of an intermediate stage of a method of manufacturing a thin-film transistor with a metal cross over structure according to some embodiments of the present disclosure. The intermediate stage shown in FIG. 1J may be sequentially followed by the intermediate stage shown in FIG. 1K. As shown in FIG. 1K, the second patterned photoresist PR2 is removed to expose the first upper metal pattern UP1 and the second upper metal pattern UP2.

Figure 3:
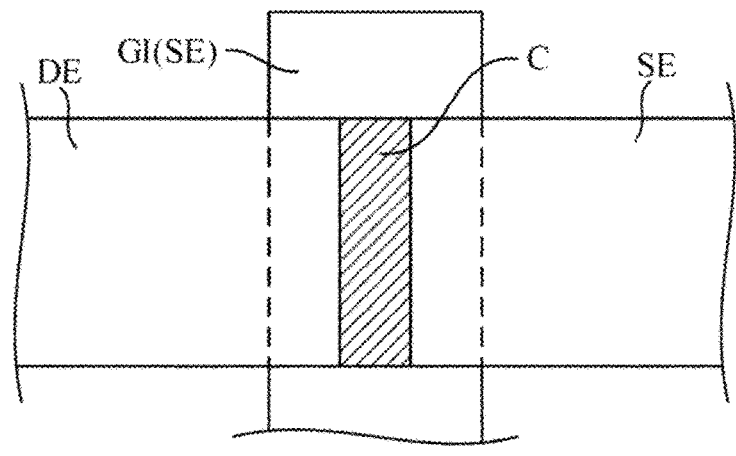
FIG. 3 is a partial top view of the structure shown in FIG. 1K according to some embodiments of the present disclosure.
Figure 4A:
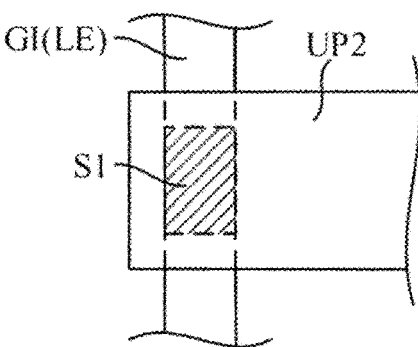
FIG. 4A is another partial top view of the structure shown in FIG. 1K according to some embodiments of the present disclosure.
Figure 5:
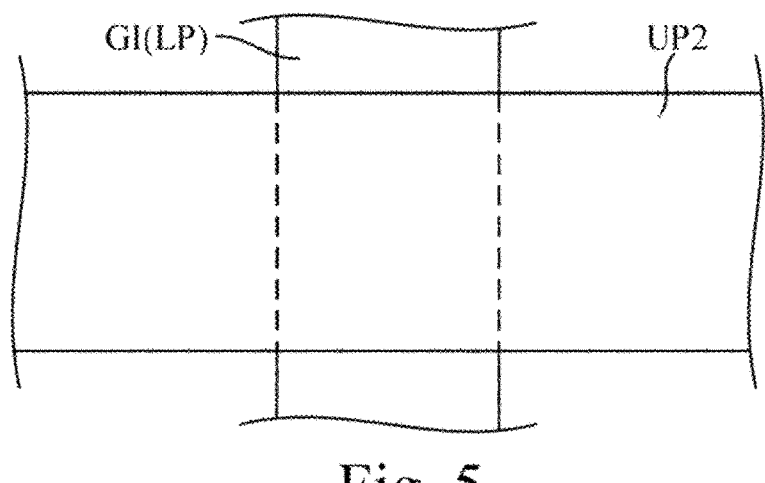
FIG. 5 is another partial top view of the structure shown in FIG. 1K according to some embodiments of the present disclosure.

Reference is made to FIGS. 3, 4A, and 5. FIGS. 3, 4A, and 5 are partial top views of the structure shown in FIG. 1K according to some embodiments of the present disclosure. In detail, FIG. 3 is a partial schematic diagram showing the anodized gate electrode GE (covered by the anodized part GI) and the first upper metal pattern UP1. FIG. 4A is a partial schematic diagram showing the anodized lower metal electrode LE (covered by the anodized part GI and exposing the surface portion S1) and the second upper metal pattern UP2 that form the aforementioned contact structure. FIG. 5 is a partial schematic diagram showing the anodized lower metal pattern LP (covered by the anodized part GI) and the second upper metal pattern UP2 that form the aforementioned metal cross over structure.

Figure 4B:
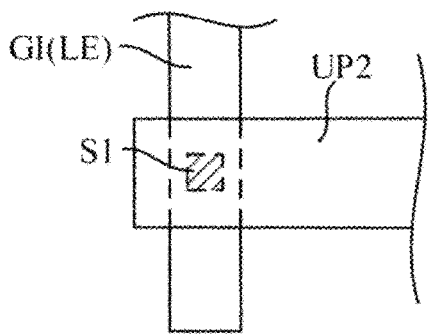
FIG. 4B is another partial top view of the structure shown in FIG. 1K according to some embodiments of the present disclosure.

Reference is made to FIG. 4B. FIG. 4B is another partial top view of the structure shown in FIG. 1K according to some embodiments of the present disclosure. As shown in FIG. 4B, the surface portion S1 of the lower metal electrode LE exposed by the anodized part GI has a smaller area than that shown in FIG. 4A.

Figure 4C:
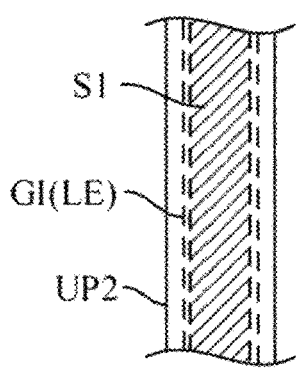
FIG. 4C is another partial top view of the structure shown in FIG. 1K according to some embodiments of the present disclosure.

Reference is made to FIG. 4C. FIG. 4C is another partial top view of the structure shown in FIG. 1K according to some embodiments of the present disclosure. As shown in FIG. 4C, both the surface portion S1 of the lower metal electrode LE exposed by the anodized part GI and the second upper metal pattern UP2 covering the lower metal electrode LE are extended along the lower metal electrode LE.

Figure 6:
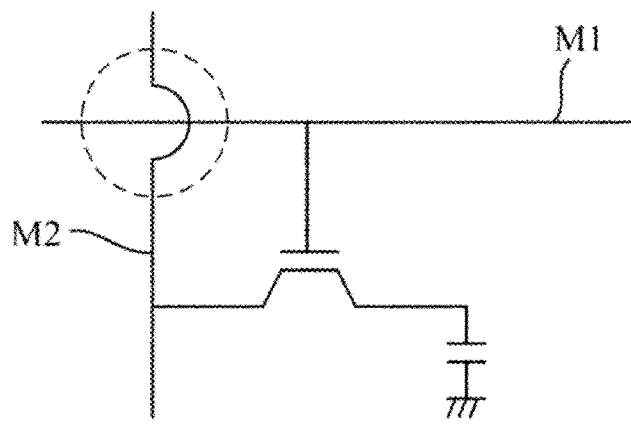
FIG. 6 is a schematic diagram of a circuit according to some embodiments of the present disclosure.

Reference is made to FIGS. 5 and 6. FIG. 6 is a schematic diagram of a circuit according to some embodiments of the present disclosure. It should be pointed out that the metal cross over structure (formed by the second upper metal pattern UP2 and the lower metal pattern LP) in FIG. 5 may correspond to the structure indicated by the dotted circle in FIG. 6 (i.e., the metal cross over structure formed by a first metal layer M1 and a second metal layer M2).

Accordingly, it can be seen that the method of manufacturing a TFT with a metal cross over structure of the embodiments as shown in FIGS. 1A to 1K only uses two sets of PEP (Photo Engraving Process). Therefore, the manufacturing cost can be significantly reduced and the manufacturing efficiency can be effectively enhanced.

Figure 7A:
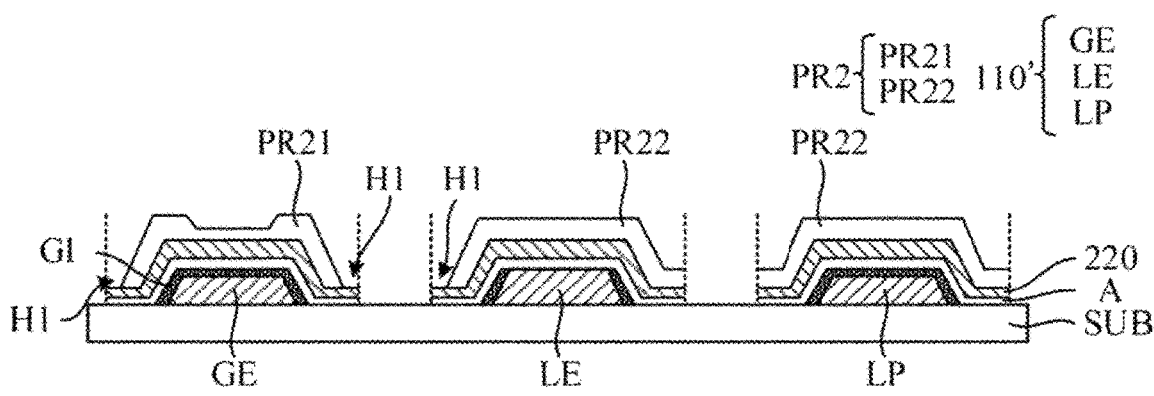
FIGS. 7A to 7E are schematic cross-sectional views of intermediate stages of a method of manufacturing a thin-film transistor with a metal cross over structure according to some embodiments of the present disclosure.

Reference is made to FIG. 7A. FIG. 7A is a schematic cross-sectional view of an intermediate stage of a method of manufacturing a thin-film transistor with a metal cross over structure according to some embodiments of the present disclosure. In some embodiments, the intermediate stage shown in FIG. 1F may be directly followed by the intermediate stage shown in FIG. 7A. As shown in FIG. 7A, a semiconductor layer A is deposited on the anodized first metal layer 110', and a second metal layer 220 is deposited on the semiconductor layer A. The deposition methods of the semiconductor layer A and the second metal layer 220 may be the same as or similar to those of the embodiments as shown in FIG. 1G, so they can be referred to the description about FIG. 1G and will not be repeated here.

As shown in FIG. 7A, a second patterned photoresist PR2 is formed on the second metal layer 220. The formation method of the second patterned photoresist PR2 may be the same as or similar to that of the first patterned photoresist PR1, so the formation of the second patterned photoresist PR2 can be referred to the description about FIGS. 1A and 1B and will not be repeated here. The second patterned photoresist PR2 has first hollow portions H1 exposing portions of the second metal layer 220.

Figure 7B:
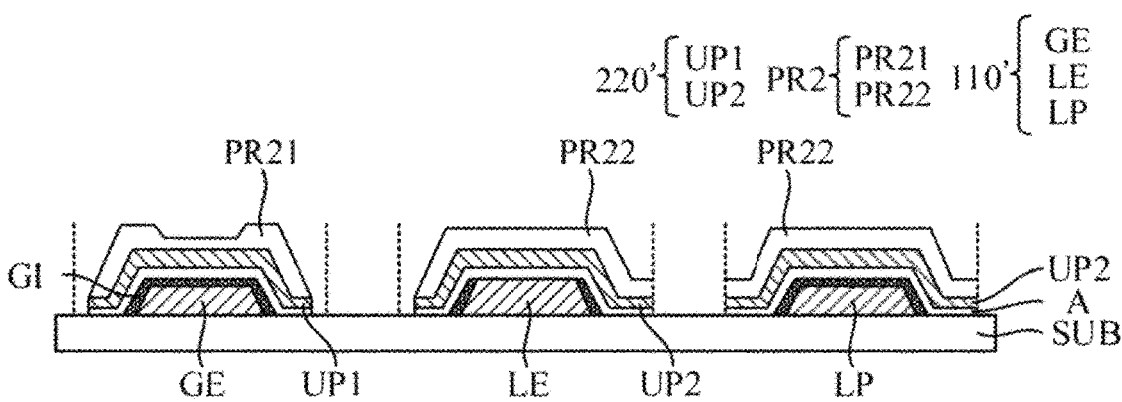

Reference is made to FIG. 7B. FIG. 7B is a schematic cross-sectional view of an intermediate stage of a method of manufacturing a thin-film transistor with a metal cross over structure according to some embodiments of the present disclosure. The intermediate stage shown in FIG. 7A may be sequentially followed by the intermediate stage shown in FIG. 7B. As shown in FIG. 7B, the second metal layer 220 is etched through the second patterned photoresist PR2 to form a first upper metal pattern UP1 and a second upper metal pattern UP2. The first upper metal pattern UP1 is above the anodized gate electrode GE and covered by a first mask portion PR21 of the second patterned photoresist PR2.

The second upper metal pattern UP2 is above the anodized lower metal pattern LP and the anodized lower metal electrode LE and covered by a second mask portion PR22 of the second patterned photoresist PR2.

Figure 7C:
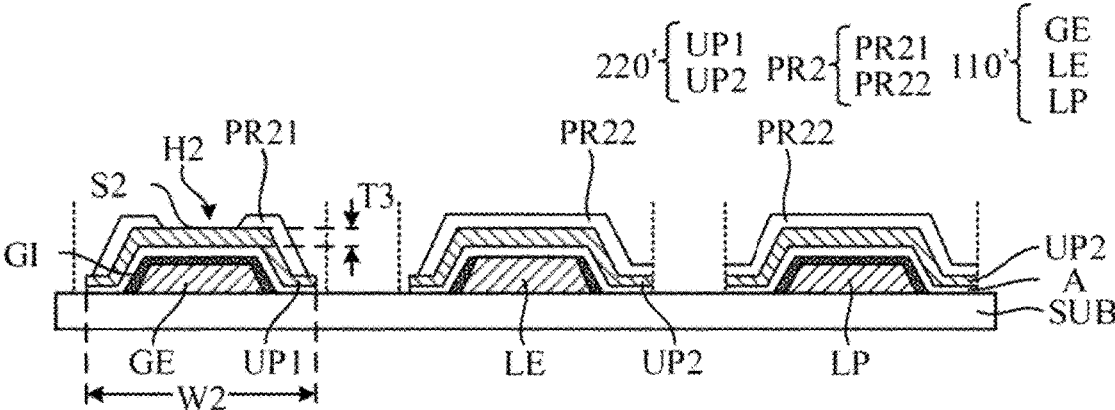

Reference is made to FIG. 7C. FIG. 7C is a schematic cross-sectional view of an intermediate stage of a method of manufacturing a thin-film transistor with a metal cross over structure according to some embodiments of the present disclosure. The intermediate stage shown in FIG. 7B may be sequentially followed by the intermediate stage shown in FIG. 7C. As shown in FIG. 7C, a part of the first mask portion PR21 of the second patterned photoresist PR2 is removed to form a second hollow portion H2. The second hollow portion H2 exposes a surface portion S2 of the first upper metal pattern UP1. In some embodiments, an ashing process is performed to the second patterned photoresist PR2 until the second hollow portion H2 is formed to expose the surface portion S2 of the first upper metal pattern UP1. In some embodiments, oxygen plasma is used in the ashing process to perform the erosion of the second patterned photoresist PR2.

Figure 7D:
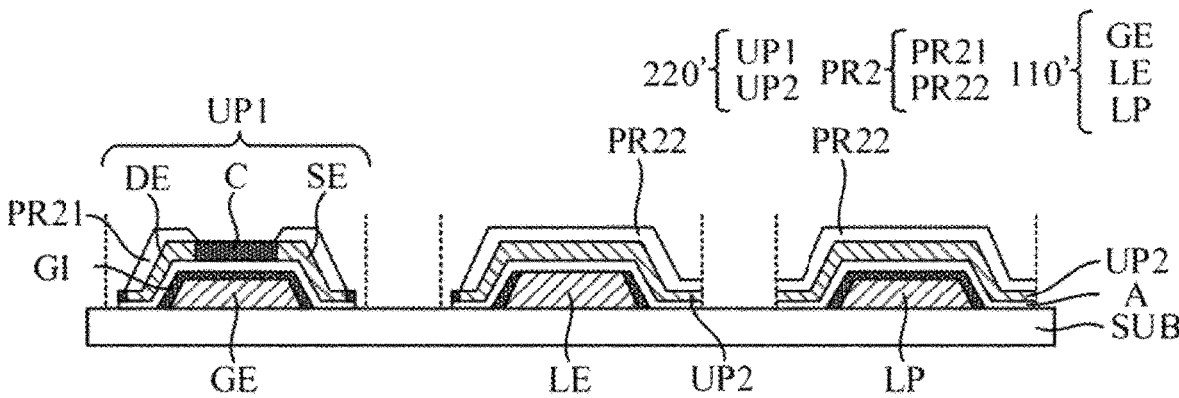

Reference is made to FIG. 7D. FIG. 7D is a schematic cross-sectional view of an intermediate stage of a method of manufacturing a thin-film transistor with a metal cross over structure according to some embodiments of the present disclosure. The intermediate stage shown in FIG. 7C may be sequentially followed by the intermediate stage shown in FIG. 7D. As shown in FIG. 7D, the surface portion S2 of the first upper metal pattern UP1 is anodized until the first upper metal pattern UP1 has a drain electrode DE, a source electrode SE, and an anodized segment C connected between and electrically isolating the drain electrode DE and the source electrode SE. The anodized segment C serves as a channel protect structure.

In some embodiments, the etched first metal layer 110' is anodized to reach a termination voltage. The gate electrode GE has a thickness T1 (e.g., a vertical length of the gate electrode GE in FIG. 1D) before being anodized, and the termination voltage is less than the thickness T1 in nm divided by 0.9 $nm-V^{-1}$. In this way, the etched first metal layer 110' will not be fully anodized and leave conductive parts.

In some embodiments, the surface portion S2 of the first upper metal pattern UP1 is anodized to reach a termination voltage. The first upper metal pattern UP1 has a width W2 and a thickness T3 before being anodized, as shown in FIG. 7C. The termination voltage is greater than a smallest one of the width W2 and the thickness T2 in nm divided by 1.5 $nm-V^{-1}$. In this way, it can be ensured that the anodized segment C can reach the side of the first upper metal pattern UP1 facing the semiconductor layer A, as shown in FIG. 7D.

Figure 7E:
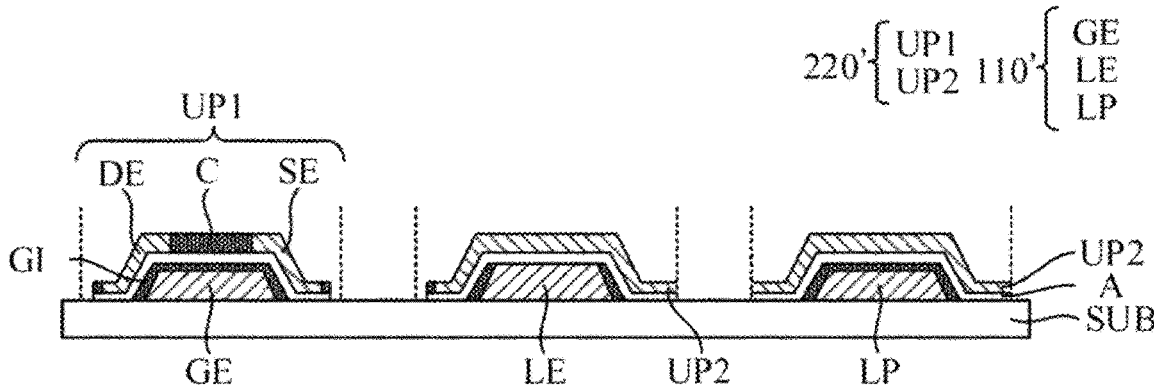

Reference is made to FIG. 7E. FIG. 7E is a schematic cross-sectional view of an intermediate stage of a method of manufacturing a thin-film transistor with a metal cross over structure according to some embodiments of the present disclosure. The intermediate stage shown in FIG. 7D may be sequentially followed by the intermediate stage shown in FIG. 7E. As shown in FIG. 7E, the second patterned photoresist PR2 is removed to expose the first upper metal pattern UP1 and the second upper metal pattern UP2.

Figure 8A:
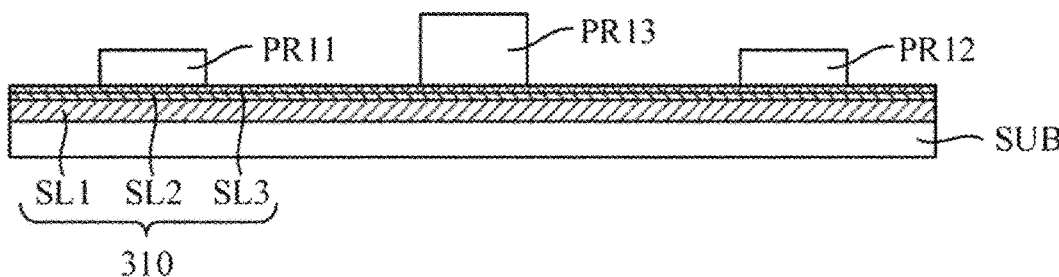
FIGS. 8A to 8F are schematic cross-sectional views of intermediate stages of a method of manufacturing a thin-film transistor with a metal cross over structure according to some embodiments of the present disclosure.

Reference is made to FIG. 8A. FIG. 8A is a schematic cross-sectional view of an intermediate stage of a method of manufacturing a thin-film transistor with a metal cross over structure according to some embodiments of the present disclosure. In some embodiments, the intermediate stage shown in FIG. 1A may be directly followed by the intermediate stage shown in FIG. 8A. In other words, the first metal layer 110 in FIG. 1A is replaced by a first metal layer 310 in FIG. 8A. As shown in FIG. 8A, the first metal layer 310 is a multi-layer structure. Specifically, the first metal layer 310 includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process. The anodization effect of molybdenum is not good, but it can be used as a barrier metal.

In some embodiments, the third sub-layer SL3 contains copper, but the disclosure is not limited in this regard. The third sub-layer SL3 which contains copper can increase the electrical conductivity of an entirety of the first metal layer 310. In some embodiments, the second sub-layer SL2 which contains molybdenum can serve as a barrier layer to prevent copper diffusion from the third sub-layer SL3 which contains copper.

In some other embodiments, the third sub-layer SL3 may contain a barrier metal such as tantalum, titanium, or tungsten, but the disclosure is not limited in this regard.

In some embodiments, one of the second sub-layer SL2 and the third sub-layer SL3 may be omitted. For example, in some embodiments, the first metal layer 310 may be a double-layer structure only including the first sub-layer SL1 and the second sub-layer SL2 which contains molybdenum. In some other embodiments, the first metal layer 310 may be a double-layer structure only including the first sub-layer SL1 and the third sub-layer SL3 which contains copper.

Figure 8B:
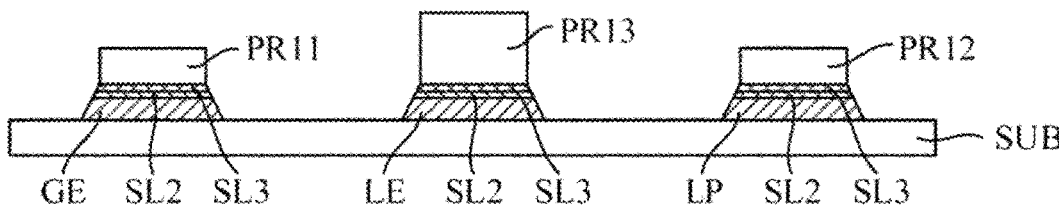

Reference is made to FIG. 8B. FIG. 8B is a schematic cross-sectional view of an intermediate stage of a method of manufacturing a thin-film transistor with a metal cross over structure according to some embodiments of the present disclosure. The intermediate stage shown in FIG. 8A may be sequentially followed by the intermediate stage shown in FIG. 8B. As shown in FIG. 8B, the first metal layer 310 is etched through the first patterned photoresist PR1, such that the etched first metal layer 310' includes a gate electrode GE, a lower metal pattern LP, and a lower metal electrode LE that are sequentially covered by the second sub-layer SL2 and the third sub-layer SL3. In addition, the gate electrode GE, a lower metal pattern LP, and a lower metal electrode LE are respectively covered by the first mask portion PR11, the second mask portion PR12, and the third mask portion PR13.

Figure 8C:
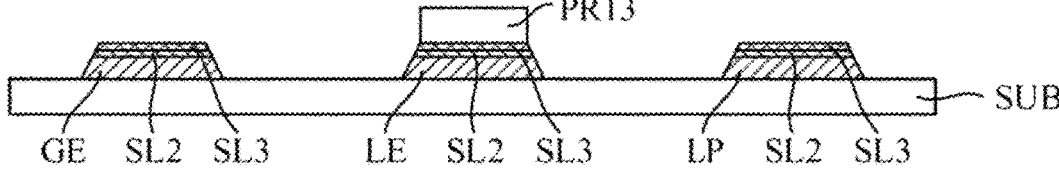

Reference is made to FIG. 8C. FIG. 8C is a schematic cross-sectional view of an intermediate stage of a method of manufacturing a thin-film transistor with a metal cross over structure according to some embodiments of the present disclosure. The intermediate stage shown in FIG. 8B may be sequentially followed by the intermediate stage shown in FIG. 8C. As shown in FIG. 8C, the first mask portion PR11 and the second mask portion PR12 are removed to expose top surfaces of the third sub-layer SL3 respectively above the gate electrode GE and the lower metal pattern LP. The step of removing the first mask portion PR11 and the second mask portion PR12 as shown in FIG. 8C is the same as or similar to that as shown in FIG. 1D, so it can be referred to the description about FIG. 1D and will not be repeated here.

Figure 8D:
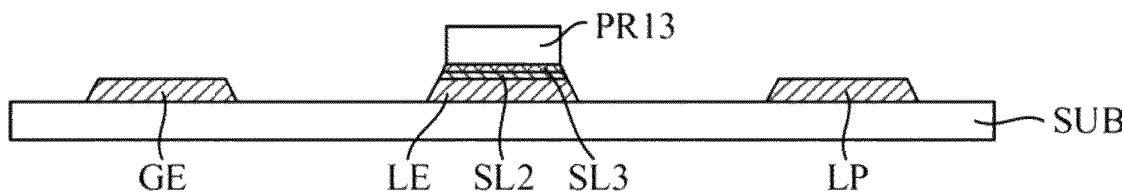

Reference is made to FIG. 8D. FIG. 8D is a schematic cross-sectional view of an intermediate stage of a method of manufacturing a thin-film transistor with a metal cross over structure according to some embodiments of the present disclosure. The intermediate stage shown in FIG. 8C may be sequentially followed by the intermediate stage shown in FIG. 8D. As shown in FIG. 8D, the third sub-layer SL3 and the second sub-layer SL2 above the gate electrode GE and the lower metal pattern LP are selectively etched (relative to the first sub-layer SL1) to expose top surfaces of the gate electrode GE and the lower metal pattern LP.

In some embodiments, the second sub-layer SL2 which contains molybdenum may be etched by using a solution containing hydrogen peroxide and citric acid.

In some embodiments, an etch selectivity of the second sub-layer SL2 and the first sub-layer SL1 in the selectively etching is higher than 2.0.

In some embodiments, the second sub-layer SL2 may be omitted. That is, the first metal layer 310 may only include the first sub-layer SL1 which contains aluminum and the third sub-layer SL3 which contains copper.

Figure 8E:
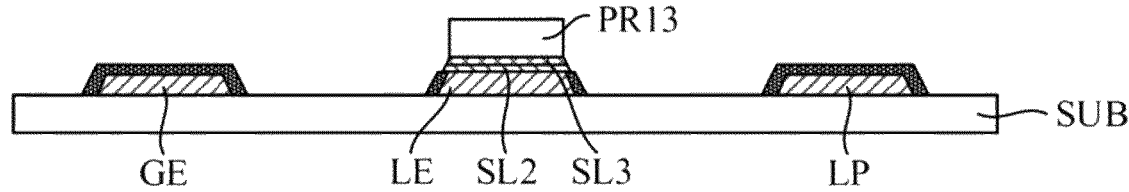

Reference is made to FIG. 8E. FIG. 8E is a schematic cross-sectional view of an intermediate stage of a method of manufacturing a thin-film transistor with a metal cross over structure according to some embodiments of the present disclosure. The intermediate stage shown in FIG. 8D may be sequentially followed by the intermediate stage shown in FIG. 8E. As shown in FIG. 8E, the gate electrode GE, the lower metal pattern LP, and the lower metal electrode LE are anodized. The step of anodizing the gate electrode GE, the lower metal pattern LP, and the lower metal electrode LE as shown in FIG. 8E is the same as or similar to that as shown in FIG. 1E, so it can be referred to the description about FIG. 1E and will not be repeated here.

Figure 8F:
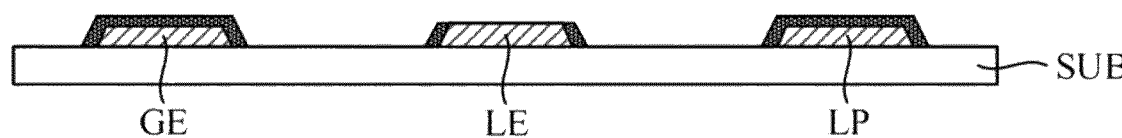

Reference is made to FIG. 8F. FIG. 8F is a schematic cross-sectional view of an intermediate stage of a method of manufacturing a thin-film transistor with a metal cross over structure according to some embodiments of the present disclosure. The intermediate stage shown in FIG. 8E may be sequentially followed by the intermediate stage shown in FIG. 8F. As shown in FIG. 8F, the third mask portion PR13 is removed to expose a top surface of the third sub-layer SL3 above the lower metal electrode LE. The step of removing the third mask portion PR13 as shown in FIG. 8F is the same as or similar to that as shown in FIG. 1F, so it can be referred to the description about FIG. 1F and will not be repeated here.

In addition, as shown in FIG. 8F, after the third mask portion PR13 is removed, the second sub-layer SL2 and the third sub-layer SL3 of the lower metal electrode LE are selectively etched (relative to the first sub-layer SL1) to expose a top surface of the lower metal electrode LE that is unanodized. The step of removing the second sub-layer SL2 and the third sub-layer SL3 as shown in FIG. 8F is the same as or similar to that as shown in FIG. 8D, so it can be referred to the description about FIG. 8D and will not be repeated here. In some embodiments, the intermediate stage shown in FIG. 8F may be sequentially followed by the intermediate stage shown in FIGS. 1G to 1K.

Figure 9A:
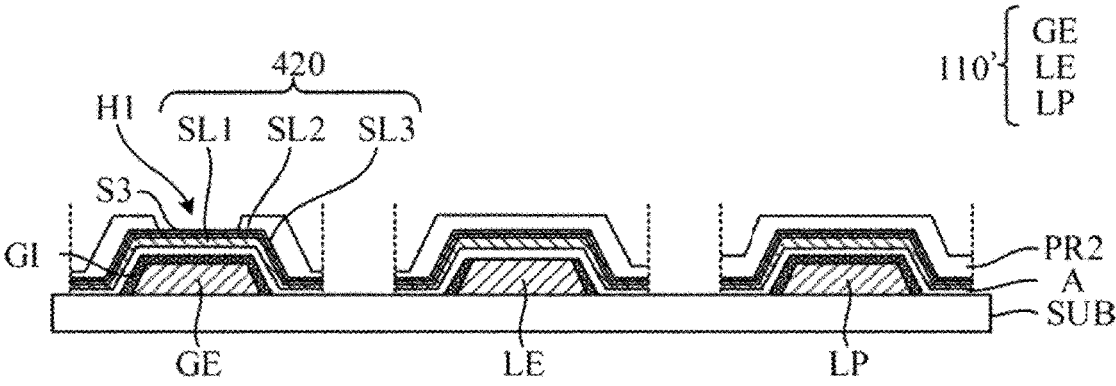
FIGS. 9A to 9C are schematic cross-sectional views of intermediate stages of a method of manufacturing a thin-film transistor with a metal cross over structure according to some embodiments of the present disclosure.

Reference is made to FIG. 9A. FIG. 9A is a schematic cross-sectional view of an intermediate stage of a method of manufacturing a thin-film transistor with a metal cross over structure according to some embodiments of the present disclosure. In some embodiments, the intermediate stage shown in FIG. 1F may be directly followed by the intermediate stage shown in FIG. 9A. As shown in FIG. 9A, a semiconductor layer A is deposited on the anodized first metal layer 110'. A second metal layer 420 is deposited on the semiconductor layer A. A second patterned photoresist PR2 is formed on the second metal layer 420. In other words, the second metal layer 120 in FIG. 1G is replaced by the second metal layer 420 in FIG. 9A. As shown in FIG. 9A, the second metal layer 420 is a multi-layer structure. Specifically, the second metal layer 420 includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2. In addition, the second patterned photoresist PR2 has a first hollow portion H1 exposing a surface portion S3 of the second metal layer 420. The surface portion S3 is a portion of the top surface of the third sub-layer SL3 right above the gate electrode GE.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process.

In some embodiments, the third sub-layer SL3 contains copper, but the disclosure is not limited in this regard.

In some embodiments, one of the second sub-layer SL2 and the third sub-layer SL3 may be omitted.

In some embodiments, the step of depositing the semiconductor layer A as shown in FIG. 9A is the same as or similar to that as shown in FIG. 1G, so it can be referred to the description about FIG. 1G and will not be repeated here. In some embodiments, the step of forming the second patterned photoresist PR2 as shown in FIG. 9A is the same as or similar to that as shown in FIG. 1G, so it can be referred to the description about FIG. 1G and will not be repeated here.

Figure 9B:
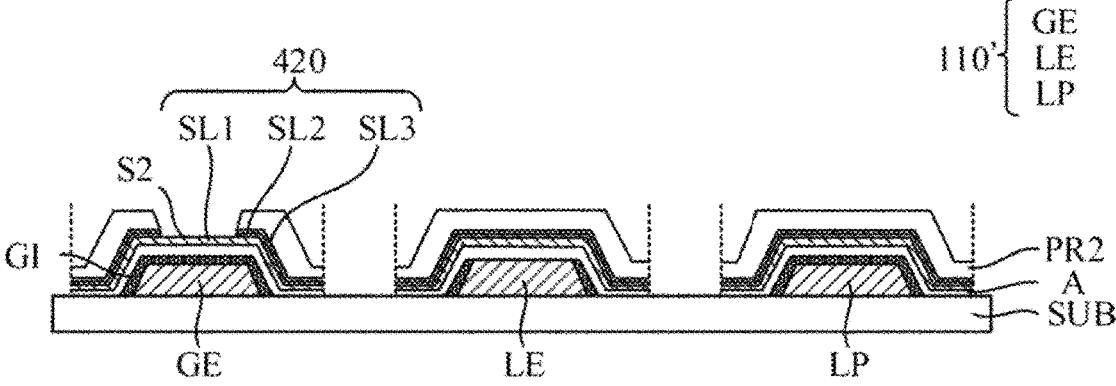

Reference is made to FIG. 9B. FIG. 9B is a schematic cross-sectional view of an intermediate stage of a method of manufacturing a thin-film transistor with a metal cross over structure according to some embodiments of the present disclosure. The intermediate stage shown in FIG. 9A may be sequentially followed by the intermediate stage shown in FIG. 9B. As shown in FIG. 9B, the third sub-layer SL3 and the second sub-layer SL2 in the first hollow portion H1 are selectively etched relative to the first sub-layer SL1 to expose a surface portion S2 of the first sub-layer SL1 in the first hollow portion H1.

In some embodiments, the second sub-layer SL2 which contains molybdenum may be etched by using hydrogen peroxide and citric acid solution.

In some embodiments, an etch selectivity of the second sub-layer SL2 and the first sub-layer SL1 in the selectively etching is higher than 2.0.

In some embodiments, the second sub-layer SL2 may be omitted. That is, the second metal layer 420 may only include the first sub-layer SL1 which contains aluminum and the third sub-layer SL3 which contains copper.

Figure 9C:
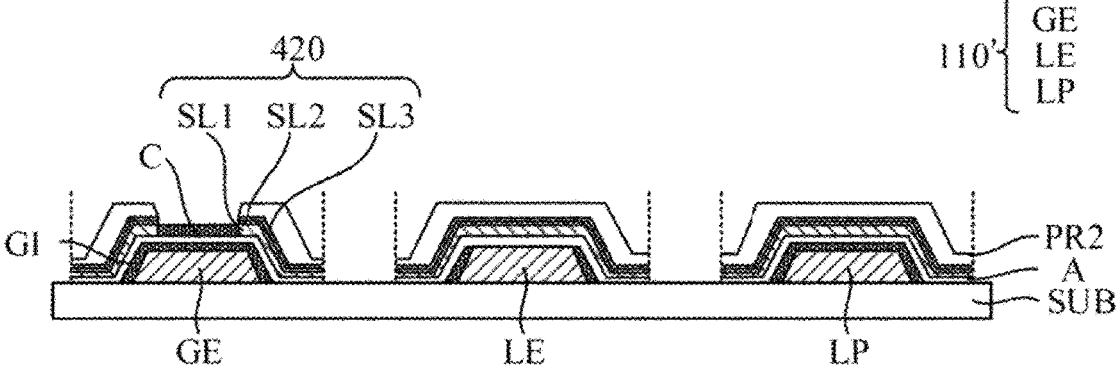

Reference is made to FIG. 9C. FIG. 9C is a schematic cross-sectional view of an intermediate stage of a method of manufacturing a thin-film transistor with a metal cross over structure according to some embodiments of the present disclosure. The intermediate stage shown in FIG. 9B may be sequentially followed by the intermediate stage shown in FIG. 9C. As shown in FIG. 9C with reference to FIG. 9B, the surface portion S2 of the first sub-layer SL1 exposed by the first hollow portion H1 is anodized through the second patterned photoresist PR2 until the second metal layer 420 has an anodized segment C extended from the surface portion of the first sub-layer SL1 exposed by the first hollow portion H1 to a side of the first sub-layer SL1 facing the semiconductor layer A. In some embodiments, the step of anodizing the first sub-layer SL1 of the second metal layer 420 as shown in FIG. 9C is the same as or similar to that as shown in FIG. 1H, so it can be referred to the description about FIG. 1H and will not be repeated here.

In some embodiments, the second metal layer 220 as shown in FIG. 7A may be replaced by the second metal layer 420 as shown in FIG. 9A, and after the second metal layer 420 is exposed by the second hollow portion H2 of the second patterned photoresist PR2 as shown in FIG. 7C, the third sub-layer SL3 and the second sub-layer SL2 in the second hollow portion H2 can be selectively etched relative to the first sub-layer SL1 to expose the first sub-layer SL1. Afterwards, the step of anodizing the second metal layer 420 (as the intermediate stage shown in FIG. 7D) and the step of removing the second patterned photoresist PR2 can be sequentially performed.

According to the foregoing recitations of the embodiments of the disclosure, it can be seen that the method of manufacturing a TFT of the present disclosure only uses two sets of PEP. Therefore, the manufacturing cost can be significantly reduced and the manufacturing efficiency can be effectively enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a thin-film transistor (TFT) with a metal cross over structure, comprising:

forming a first patterned photoresist on a first metal layer containing a content of aluminum greater than 80 wt %, wherein the first patterned photoresist has first, second, and third mask portions, and the third mask portion is thicker than the first and second mask portions;

etching the first metal layer through the first patterned photoresist to form a gate electrode, a lower metal pattern, and a lower metal electrode respectively covered by the first, second, and third mask portions;

removing the first and second mask portions;

anodizing the etched first metal layer, wherein the anodized lower metal electrode has a surface portion that is unanodized and in contact with the third mask portion;

removing the third mask portion to expose the surface portion;

depositing a semiconductor layer to cover the gate electrode, the lower metal pattern, and the lower metal electrode;

depositing a second metal layer on the semiconductor layer, wherein a surface of the second metal layer in contact with the semiconductor layer contains aluminum;

forming a second patterned photoresist on the second metal layer, wherein the second patterned photoresist has a first hollow portion exposing a surface portion of the second metal layer;

anodizing the surface portion of the second metal layer through the second patterned photoresist until the second metal layer has an anodized segment extended from the surface portion of the second metal layer to a side of the second metal layer facing the semiconductor layer;

forming second hollow portions in the second patterned photoresist; and etching the second metal layer through the second hollow portions to form a first upper metal pattern and a second upper metal pattern, wherein the first upper metal pattern is above the gate electrode and has drain and source electrodes connected to the anodized segment and electrically isolated from each other by the anodized segment, and the second upper metal pattern forms a metal cross over structure and a contact structure respectively with the lower metal pattern and the lower metal electrode.

2. The method of claim 1, wherein the anodizing the etched first metal layer is performed to reach a termination voltage, the gate electrode has a thickness and a width before the anodizing the etched first metal layer, and the termination voltage is less than a smallest one of the thickness and the width in nm divided by 0.9 nm-$V^{-1}$.

3. The method of claim 1, wherein the anodizing the etched first metal layer is performed to reach a termination voltage greater than 10 Volt and smaller than 500 Volt.

4. The method of claim 1, wherein the anodizing the etched first metal layer uses an electrolyte with a pH value between pH5 and pH8.

5. The method of claim 1, wherein the anodizing the etched first metal layer uses an electrolyte containing a content of water less than 45 wt %.

6. The method of claim 1, wherein the anodizing the etched first metal layer is performed at a temperature under 15° C.

7. The method of claim 1, wherein a thickness of an unanodized part of the gate electrode after the anodizing the etched first metal layer is equal to or greater than 1/10 of a thickness of the gate electrode before the anodizing the etched first metal layer.

8. The method of claim 1, wherein the semiconductor layer is an oxide semiconductor layer comprising at least one element of aluminum, gallium, indium, zinc, tin, and zirconium.

9. The method of claim 1, wherein the semiconductor layer comprises $MoS_2$.

10. The method of claim 1, wherein a thickness of the semiconductor layer is smaller than 100 nm.

11. The method of claim 1, wherein the depositing the semiconductor layer and the depositing the second metal layer are performed continuously in vacuum.

12. The method of claim 1, wherein the depositing the semiconductor layer and the depositing the second metal layer are performed in chambers with transferring in vacuum.

13. The method of claim 1, wherein the anodizing the surface portion of the second metal layer is performed to reach a termination voltage, the second metal layer has a thickness, and the termination voltage is greater than the thickness in nm divided by 1.5 nm-$V^{-1}$.

14. The method of claim 1, further comprising:

removing the second patterned photoresist after the etching the second metal layer.

15. The method of claim 1, wherein an etch selectivity of the second metal layer and the anodized segment in the etching the second metal layer is higher than 2.0.

16. The method of claim 1, wherein the first metal layer comprises a first sub-layer containing aluminum and at least one second sub-layer stacked on the first sub-layer, wherein the method further comprises selectively etching the at least one second sub-layer relative to the first sub-layer to expose the first sub-layer after the removing the first and second mask portions of the first patterned photoresist and before the anodizing the etched first metal layer, wherein an etch selectivity of the at least one second sub-layer and the first sub-layer in the selectively etching is higher than 2.0.

17. The method of claim 16, wherein the at least one second sub-layer contains at least one element of molybdenum and copper.

18. The method of claim 1, wherein the anodizing the etched first metal layer is performed by applying a constant current greater than 0.5 mA/cm$^2$.

19. The method of claim 18, wherein the anodizing the etched first metal layer is performed until a termination voltage is reached and kept for at least 300 seconds.

20. The method of claim 1, wherein the second metal layer comprises a first sub-layer containing aluminum and at least one second sub-layer stacked on the first sub-layer, wherein the first sub-layer has the surface portion of the second metal layer, and the method further comprises selectively etching the at least one second sub-layer relative to the first sub-layer to expose the surface portion of the first sub-layer after the forming the second patterned photoresist and before the anodizing the surface portion of the second metal layer, wherein an etch selectivity of the at least one second sub-layer and the first sub-layer in the selectively etching is higher than 2.0.

21. The method of claim 20, wherein the at least one second sub-layer contains at least one element of molybdenum and copper.

22. A method of manufacturing a thin-film transistor (TFT) with a metal cross over structure, comprising:

forming a first patterned photoresist on a first metal layer containing a content of aluminum greater than 80 wt %, wherein the first patterned photoresist has first, second, and third mask portions, and the third mask portion is thicker than the first and second mask portions;

etching the first metal layer through the first patterned photoresist to form a gate electrode, a lower metal pattern, and a lower metal electrode respectively covered by the first, second, and third mask portions;

removing the first and second mask portions;

anodizing the etched first metal layer, wherein the anodized lower metal electrode has a surface portion that is unanodized and in contact with the third mask portion;

removing the third mask portion to expose the surface portion;

depositing a semiconductor layer to cover the gate electrode, the lower metal pattern, and the lower metal electrode;

depositing a second metal layer on the semiconductor layer, wherein a surface of the second metal layer in contact with the semiconductor layer contains aluminum;

etching the second metal layer through a second patterned photoresist to form a first upper metal pattern and a second upper metal pattern, the first upper metal pattern is above the gate electrode and covered by a first mask portion of the second patterned photoresist, and the second upper metal pattern forms a metal cross over structure and a contact structure respectively with the lower metal pattern and the lower metal electrode and covered by a second mask portion of the second patterned photoresist;

removing a part of the first mask portion of the second patterned photoresist to expose a surface portion of the first upper metal pattern; and anodizing the surface portion of the first upper metal pattern until the first upper metal pattern has drain and source electrodes and an anodized segment connected between and electrically isolating the drain and source electrodes.

23. The method of claim 22, wherein the anodizing the etched first metal layer is performed to reach a termination voltage, the gate electrode has a thickness and a width before being anodized, and the termination voltage is less than a smallest one of the thickness and the width in nm divided by $0.9$ nm-$V^{-1}$.

24. The method of claim 22, wherein the anodizing the etched first metal layer is performed to reach a termination voltage greater than 10 Volt and smaller than 500 Volt.

25. The method of claim 22, wherein the anodizing the etched first metal layer uses an electrolyte with a pH value between pH5 and pH8.

26. The method of claim 22, wherein the anodizing the etched first metal layer uses an electrolyte containing a content of water less than 45 wt %.

27. The method of claim 22, wherein the anodizing the etched first metal layer is performed at a temperature under 15° C.

28. The method of claim 22, wherein a thickness of an unanodized part of the gate electrode after the anodizing the etched first metal layer is equal to or greater than $1/10$ of a thickness of the gate electrode before the anodizing the etched first metal layer.

29. The method of claim 22, wherein the semiconductor layer is an oxide semiconductor layer comprising at least one element of Aluminum, Gallium, Indium, Zinc, Tin, and Zirconium.

30. The method of claim 22, wherein the semiconductor layer comprises $MoS_2$.

31. The method of claim 22, wherein a thickness of the semiconductor layer is smaller than 100 nm.

32. The method of claim 22, wherein the depositing the semiconductor layer and the depositing the second metal layer are performed continuously in vacuum.

33. The method of claim 22, wherein the depositing the semiconductor layer and the depositing the second metal layer are performed in chambers with transferring in vacuum.

34. The method of claim 22, wherein the anodizing the surface portion of the first upper metal pattern is performed to reach a termination voltage, the first upper metal pattern has a width and a thickness before being anodized, and the termination voltage is greater than a smallest one of the width and the thickness in nm divided by 1.5 nm-$V^{-1}$.

35. The method of claim 22, wherein the anodizing the surface portion of the first upper metal pattern is performed to reach a termination voltage, the gate electrode has a thickness before the anodizing the etched first metal layer, and the termination voltage is less than the thickness in nm divided by 0.9 nm-$V^{-1}$.

36. The method of claim 22, further comprising:

removing the second patterned photoresist after the anodizing the surface portion of the first upper metal pattern.

37. The method of claim 22, wherein the first metal layer comprises a first sub-layer containing aluminum and at least one second sub-layer stacked on the first sub-layer, wherein the method further comprises selectively etching the at least one second sub-layer relative to the first sub-layer to expose the first sub-layer after the removing the first and second mask portions of the first patterned photoresist and before the anodizing the etched first metal layer, wherein an etch selectivity of the at least one second sub-layer and the first sub-layer in the selectively etching is higher than 2.0.

38. The method of claim 37, wherein the at least one second sub-layer contains at least one element of molybdenum and copper.

39. The method of claim 22, wherein the anodizing the etched first metal layer is performed by applying a constant current greater than 0.5 mA/$cm^2$.

40. The method of claim 39, wherein the anodizing the etched first metal layer is performed until a termination voltage is reached and kept for at least 300 seconds.

41. The method of claim 22, wherein the second metal layer comprises a first sub-layer containing aluminum and at least one second sub-layer stacked on the first sub-layer, wherein the first sub-layer has the surface portion of the second metal layer, and the method further comprises selectively etching the at least one second sub-layer relative to the first sub-layer to expose the surface portion of the first sub-layer after the removing the part of the first mask portion of the second patterned photoresist and before the anodizing the surface portion of the first upper metal pattern, wherein an etch selectivity of the at least one second sub-layer and the first sub-layer in the selectively etching is higher than 2.0.

42. The method of claim 41, wherein the at least one second sub-layer contains at least one element of molybdenum and copper.

* * * * *